United States Patent
Kim et al.

(10) Patent No.: US 11,315,495 B2
(45) Date of Patent: Apr. 26, 2022

(54) GATE DRIVING CIRCUIT AND DISPLAY DEVICE HAVING THE SAME

(71) Applicant: Samsung Display Co., Ltd., Yongin-si (KR)

(72) Inventors: Kang Nam Kim, Seoul (KR); You Mee Hyun, Bucheon-si (KR); Beom Jun Kim, Seoul (KR); Jong Hwan Lee, Asan-si (KR); Sung Hoon Lim, Suwon-si (KR); Duc Han Cho, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 73 days.

(21) Appl. No.: 15/488,259

(22) Filed: Apr. 14, 2017

(65) Prior Publication Data

US 2018/0018920 A1 Jan. 18, 2018

(30) Foreign Application Priority Data

Jul. 14, 2016 (KR) .......................... 10-2016-0089260

(51) Int. Cl.
| | |
|---|---|
| G11C 19/00 | (2006.01) |
| G09G 3/3266 | (2016.01) |
| G09G 3/20 | (2006.01) |
| G11C 19/28 | (2006.01) |
| G09G 3/36 | (2006.01) |

(52) U.S. Cl.
CPC ............. *G09G 3/3266* (2013.01); *G09G 3/20* (2013.01); *G09G 3/3677* (2013.01); *G11C 19/28* (2013.01); *G09G 2300/0426* (2013.01); *G09G 2310/0267* (2013.01); *G09G 2310/0286* (2013.01); *G09G 2310/08* (2013.01); *G09G 2320/0223* (2013.01)

(58) Field of Classification Search
None
See application file for complete search history.

(56) References Cited

U.S. PATENT DOCUMENTS

| | | | |
|---|---|---|---|
| 8,023,613 | B2 | 9/2011 | Tsai et al. |
| 8,160,198 | B2 | 4/2012 | Tsai et al. |
| 8,593,385 | B2 | 11/2013 | Lee et al. |

(Continued)

FOREIGN PATENT DOCUMENTS

| | | |
|---|---|---|
| CN | 101814274 A | 8/2010 |
| CN | 102024437 A | 4/2011 |

(Continued)

OTHER PUBLICATIONS

Chinese Office Action dated Sep. 29, 2020, issued in Chinese Patent Application No. 201710573782.1 (10 pages).

(Continued)

*Primary Examiner* — Tuan T Lam
(74) *Attorney, Agent, or Firm* — Lewis Roca Rothgerber Christie LLP

(57) ABSTRACT

A gate driving circuit including a controller for providing a first carry signal to a control node, a first pull-up portion for outputting a first clock signal as a first gate signal in accordance with a signal provided to the control node, and a second pull-up portion for outputting a second clock signal with a phase that is different from the first clock signal as a second gate signal in accordance with the signal provided to the control node.

18 Claims, 13 Drawing Sheets

(56) References Cited

U.S. PATENT DOCUMENTS

| | | | | |
|---|---|---|---|---|
| 8,860,648 B2* | 10/2014 | Lee | ............ | G11C 19/28 345/100 |
| 9,305,498 B2 | 4/2016 | Wang | | |
| 2008/0219401 A1* | 9/2008 | Tobita | ............ | G09G 3/3677 377/79 |
| 2010/0097368 A1* | 4/2010 | Hwang | ............ | G09G 3/3677 345/213 |
| 2010/0277206 A1* | 11/2010 | Lee | ............ | G11C 19/184 327/108 |
| 2011/0058642 A1* | 3/2011 | Tsai | ............ | G09G 3/3677 377/79 |
| 2011/0293063 A1 | 12/2011 | Tsai et al. | | |
| 2012/0293467 A1* | 11/2012 | Lee | ............ | G09G 3/3677 345/204 |
| 2013/0033468 A1* | 2/2013 | Takahashi | ............ | G09G 3/20 345/204 |
| 2013/0335392 A1* | 12/2013 | Cho | ............ | H03K 3/00 345/211 |
| 2014/0198022 A1* | 7/2014 | Chou | ............ | G09G 3/3677 345/92 |
| 2015/0154902 A1 | 6/2015 | Lee et al. | | |
| 2015/0317954 A1* | 11/2015 | Jang | ............ | G09G 3/20 345/213 |
| 2016/0204136 A1* | 7/2016 | Takeuchi | ............ | H01L 27/1225 345/213 |
| 2016/0247442 A1* | 8/2016 | Dai | ............ | G09G 3/3677 |
| 2017/0193957 A1* | 7/2017 | Liu | ............ | G09G 3/3696 |
| 2017/0243556 A1* | 8/2017 | Cao | ............ | G11C 19/28 |
| 2017/0330526 A1* | 11/2017 | Fan | ............ | G09G 3/3677 |

FOREIGN PATENT DOCUMENTS

| | | |
|---|---|---|
| CN | 102368380 A | 3/2012 |
| CN | 103617775 | 3/2014 |
| CN | 104134430 | 11/2014 |
| CN | 104157248 | 11/2014 |
| KR | 10-2012-0134804 | 12/2012 |
| KR | 10-2015-0065572 | 6/2015 |
| KR | 10-2016-0004181 | 1/2016 |
| KR | 10-1587610 | 1/2016 |
| TW | 201110095 A1 | 3/2011 |

OTHER PUBLICATIONS

Rejection Decision issued in corresponding Chinese Application No. 201710573782.1, dated Dec. 2, 2021, 7 pages.

* cited by examiner

GATE DRIVING CIRCUIT AND DISPLAY DEVICE HAVING THE SAME

CROSS-REFERENCE TO RELATED APPLICATION

This application claims priority to, and the benefit of, Korean Patent Application No. 10-2016-0089260 filed on Jul. 14, 2016 in the Korean Intellectual Property Office, the disclosure of which is incorporated herein by reference in its entirety.

BACKGROUND

1. Field

Embodiments of the present invention relate to a gate driving circuit and a display device including the same.

2. Description of the Related Art

Significance of display devices is increasing with the development of multimedia. In response thereto, various types of display devices, such as a liquid crystal display device (LCD) and an organic light emitting (OLED), are used.

Display devices include a gate driving circuit for applying a plurality of gate signals to a plurality of gate lines. The gate driving circuit is directly attached to a display substrate in the form of a plurality of integrated circuit chips, or is attached to the display substrate by being mounted to a flexible circuit film or the like.

SUMMARY

An aspect of embodiments of the present invention provides a gate driving circuit capable of improving a display quality by improving a delay phenomenon of a gate signal, and a display device including the same.

Another aspect of embodiments of the present invention provides a gate driving circuit capable of achieving a narrow bezel by reducing an integration area of the gate driving circuit, and a display device including the gate driving circuit.

The aspects of the embodiments of the present invention are not limited to the aforementioned aspects, but other aspects that have not been mentioned will be clearly understood by those skilled in the art from the following description.

According to embodiments of the present invention, it is possible to improve the display quality by improving the delay phenomenon of the gate signal.

Also, a narrow bezel can be achieved by reducing the integration area of the gate driving circuit.

However, embodiments of the present disclosure are not restricted to those set forth herein. The above and other embodiments of the present disclosure will become more apparent to one of ordinary skill in the art to which the present disclosure pertains by referencing the detailed description of the present disclosure given below.

An embodiment of the present invention provides a gate driving circuit including a controller for providing a first carry signal to a control node, a first pull-up portion for outputting a first clock signal as a first gate signal in accordance with a signal provided to the control node, and a second pull-up portion for outputting a second clock signal with a phase that is different from the first clock signal as a second gate signal in accordance with the signal provided to the control node.

The first pull-up portion may include a first pull-up transistor including a gate electrode connected to the control node, an input terminal for receiving the first clock signal, and an output terminal for outputting the first gate signal, and wherein the second pull-up portion includes a second pull-up transistor including a gate electrode connected to the control node, an input terminal for receiving the second clock signal, and an output terminal for outputting the second gate signal.

The controller may include a gate electrode for receiving the first carry signal, a control transistor connected to the control node, and a control capacitor including a first electrode connected to the gate electrode, and a second electrode connected to the output terminal of the first pull-up transistor.

The gate driving circuit may further include a first pull-down transistor including a gate electrode for receiving a second carry signal having a phase that is different from a phase of the first carry signal, an input terminal for receiving a first off-voltage, and an output terminal connected to an output terminal of the first pull-up transistor, a second pull-down transistor including a gate electrode for receiving a third carry signal having a phase that is different from the phase of the second carry signal, an input terminal for receiving the first off-voltage, and an output terminal connected to the output terminal of the second pull-up transistor, and a third pull-down transistor including a gate electrode for receiving the third carry signal, an input terminal for receiving the first off-voltage, and an output terminal connected to the output terminal of the control transistor.

The control transistor may be a diode-connected transistor including an input terminal and a gate electrode that are connected to each other.

An embodiment of the present invention also includes a gate driving circuit including a plurality of stages connected to each other in series, each of the stages being configured to output two gate signals, wherein each of the stages includes a controller for providing a first carry signal from a previous one of the stages to a control node, a first pull-up portion for outputting a first clock signal as a first gate signal in accordance with a signal provided to the control node, a second pull-up portion for outputting a second clock signal having a phase that is different from a phase of the first clock signal as a second gate signal in accordance with the signal provided to the control node, and a carry portion for outputting the second clock signal as a second carry signal in accordance with the signal provided to the control node.

Each of the stages may be configured to sequentially output the first gate signal and the second gate signal.

The controller may include a second pull-down portion for providing a first off-voltage to the second pull-up portion in accordance with a third carry signal provided from a subsequent one of the stages, and a third pull-down portion for providing a second off-voltage to the control node in accordance with the third carry signal.

The second pull-down portion may include a second pull-down transistor including a gate electrode for receiving the third carry signal, an input terminal for receiving the first off-voltage, and an output terminal connected to the second pull-up portion.

The third pull-down portion may include a third pull-down transistor including a gate electrode for receiving the third carry signal, an input terminal for receiving the second off-voltage, and an output terminal connected to the control node.

The gate driving circuit may further include a first holding portion for holding the first gate signal at a first off-voltage, a second holding portion for holding the second carry signal at a second off-voltage, and a third holding portion for holding the control node at the second off-voltage.

The gate driving circuit may further include an inverter for controlling operation of the first, second, and third holding portions.

The first pull-up portion may include a first pull-up transistor including a gate electrode connected to the control node, an input terminal for receiving the first clock signal, and an output terminal for outputting the first gate signal, and the second pull-up portion may include a second pull-up transistor including a gate electrode connected to the control node, an input terminal for receiving the second clock signal, and an output terminal for outputting the second gate signal.

The controller may include a gate electrode for receiving the first carry signal, a control transistor connected to the control node, and a control capacitor including a first electrode connected to the gate electrode of the first pull-up transistor, and a second electrode connected to the output terminal of the first pull-up transistor.

An embodiment of the present invention also includes a display device including a display panel including a plurality of pixels connected to first to third gate lines adjacent one another, a first gate driving circuit on a first side of the display panel and including a first stage for outputting first and second gate signals having phases that are different from each other, and a second gate driving circuit on a second side of the display panel that is opposite the first side of the display panel, and including a second stage for outputting third and fourth gate signals having phases that are different from each other, wherein the first stage is configured to provide the first gate signal to a first side of the second gate line, wherein the second stage is configured to provide the fourth gate signal to a second side of the second gate line, wherein the first stage is configured to provide the second gate signal to a first side of the third gate line, and wherein the second stage is configured to provide the third gate signal to a second side of the first gate line.

The first stage may include a controller for providing a first carry signal to a control node, a first pull-up portion for outputting a first clock signal as the first gate signal in accordance with a signal provided to the control node, and a second pull-up portion for outputting a second clock signal having a phase that is different from a phase of the first clock signal as the second gate signal in accordance with the signal provided to the control node.

The first pull-up portion may include a first pull-up transistor including a gate electrode connected to the control node, an input terminal for receiving the first clock signal, and an output terminal for outputting the first gate signal, the second pull-up portion may include a second pull-up transistor including a gate electrode connected to the control node, an input terminal for receiving the second clock signal, and an output terminal for outputting the second gate signal, and the controller may include a gate electrode for receiving the first carry signal, a first control transistor connected to the control node, and a control capacitor including a first electrode connected to the gate electrode of the first pull-up transistor, and a second electrode connected to the output terminal of the first pull-up transistor.

The second stage may include a controller for providing a first carry signal to a control node, a first pull-up portion for outputting a first clock signal as the third gate signal in accordance with the first carry signal provided to the control node, and a second pull-up portion for outputting a second clock signal having a phase that is different from the phase of the first clock signal as the fourth gate signal in accordance with the first carry signal provided to the control node.

The first pull-up portion may include a first pull-up transistor including a gate electrode connected to the control node, an input terminal for receiving the first clock signal, and an output terminal for outputting the third gate signal, the second pull-up portion may include a second pull-up transistor including a gate electrode connected to the control node, an input terminal for receiving the second clock signal, and an output terminal for outputting the fourth gate signal, and the controller may include a gate electrode for receiving the first carry signal, a control transistor connected to the control node, and a control capacitor including a first electrode connected to the gate electrode of the first pull-up transistor, and a second electrode connected to the output terminal of the first pull-up transistor.

The first gate driving circuit may further include a third stage that is adjacent the first stage, and has a first output terminal and a second output terminal for outputting two respective gate signals having phases that are different from each other, the second gate driving circuit may further include a fourth stage that is adjacent the second stage, and has a first output terminal and a second output terminal for outputting two respective gate signals having phases that are different from each other, the second output terminal of the third stage may be connected to a first side of the first gate line, and the first output terminal of the fourth stage may be connected to a second side of the third gate line.

BRIEF DESCRIPTION OF THE DRAWINGS

The above and other aspects and features of embodiments of the present invention will become more apparent by providing a detailed description of embodiments with reference to the attached drawings, in which.

DETAILED DESCRIPTION

Figure 1:
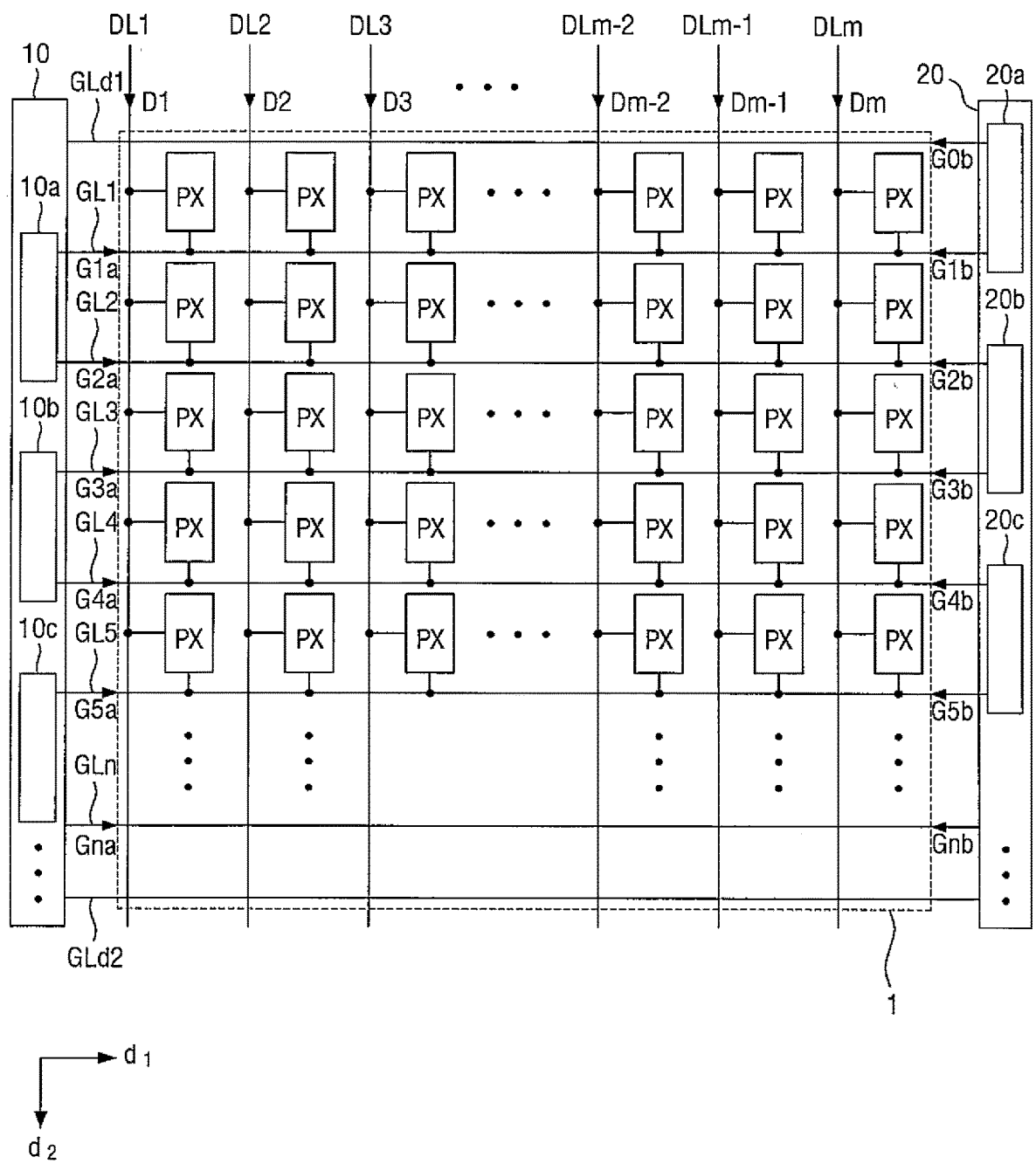
FIG. 1 is a diagram schematically illustrating an arrangement of a display device according to an embodiment of the present invention.

Features of the inventive concept and methods of accomplishing the same may be understood more readily by reference to the following detailed description of embodiments and the accompanying drawings. Hereinafter, embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

In the following description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. In addition, it will also be understood that when an element or layer is referred to as being "between" two elements or layers, it can be the only element or layer between the two elements or layers, or one or more intervening elements or layers may also be present.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

In the following examples, the x-axis, the y-axis and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, embodiments will be described with reference to the accompanying drawings.

Figure 2:
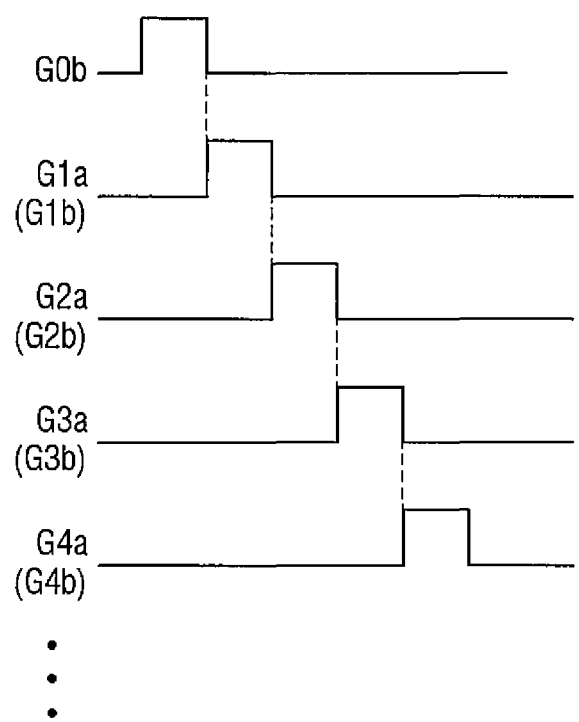
FIG. 2 is a waveform diagram illustrating an output order of gate signals in the display device illustrated in FIG. 1.

FIG. 1 is a diagram schematically illustrating an arrangement of a display device according to an embodiment of the present invention. FIG. 2 is a waveform diagram illustrating an output order of gate signals in the display device illustrated in FIG.

Referring to FIGS. 1 and 2, a display device according to an embodiment of the present invention may include a display panel 1, a first gate driving circuit 10, and a second gate driving circuit 20.

The display panel 1 is a panel that displays images. In an embodiment, the display panel 1 may include a lower display panel, an upper display panel that is opposite to the lower display panel, and a liquid crystal layer interposed therebetween. In another embodiment, the display panel 1 may include a lower display panel, an upper display panel that is opposite to the lower display panel, and an organic light emitting layer.

The display panel 1 may be electrically connected to first to n-th gate lines (GL1 to GLn) and first to m-th data lines (DL1 to DLm). The display panel 1 may include a plurality of pixels PX connected to each of one of the first to n-th gate lines (GL1 to GLn) and one of the first to m-th data lines (DL1 to DLm).

The first to n-th gate lines (GL1 to GLn) may extend in a first direction d1 in an embodiment. The first to n-th gate lines (GL1 to GLn) may be connected to first and second gate driving circuits 10 and 20 to be described later. As a result, the first to n-th gate lines (GL1 to GLn) may receive a plurality of first to n-th gate signals (G1a to Gna) from the first gate driving circuit 10, and may receive a plurality of first to n-th gate signals (G1b to Gnb) from the second gate driving circuit 20.

The first to m-th data lines (DL1 to DLm) may extend in a second direction d2 in an embodiment. The first to m-th data lines (DL1 to DLm) may be connected to a data driver. As a result, the first to m-th data lines (DL1 to DLm) may receive a plurality of first to m-th data signals (D1 to Dm) from the data driver.

The first direction d1 may intersect perpendicularly with the second direction d2 in an example. With reference to FIG. 1, the first direction d1 is illustrated as a column direction (e.g., a direction going across columns) and the second direction d2 is illustrated as a row direction (e.g., a direction going across rows). The first to n-th gate lines (GL1 to GLn) are electrically insulated from the first to m-th data lines (DL1 to DLm).

The first gate driving circuit 10 may be on one side of the display panel 1. The second gate driving circuit 20 may be on the other side of the display panel 1 that is opposite to the one side of the display panel 1 corresponding to the first gate driving circuit 10. That is, the display panel 1 may be between the first gate driving circuit 10 and the second gate driving circuit 20. For example, with reference to FIG. 1, the first gate driving circuit 10 may be on the left side of the display panel 1, and the second gate driving circuit 20 may be on the right side of the display panel 1. Hereinafter, a plurality of stages (10a, 10b, 10c . . . ) included in the first gate driving circuit 10 will be referred to as odd stages, and a plurality of stages (20a, 20b, 20c . . . ) included in the second gate driving circuit 20 will be referred to as even stages. Further, a plurality of gate signals output from the first gate driving circuit 10 will be referred to as a plurality of odd gate signals, and a plurality of gate signals output from the second gate driving circuit 20 will be referred to as a plurality of even gate signals.

The first gate driving circuit 10 may include a plurality of odd stages (10a, 10b, 10c . . . ). Each of the plurality of odd stages (10a, 10b, 10c . . . ) may include two output terminals, and may output two gate signals via the two output terminals. Here, the two gate signals may be different from each other in phase. Hereinafter, the description will be provided based on the first odd stage 10a and the second odd stage 10b among the plurality of odd stages (10a, 10b, 10c . . . ).

The first odd stage 10a may be connected to one side of the first gate line GL1 and to one side of the second gate line GL2. The first odd stage 10a may include two output terminals, and may provide the first odd gate signal G1a and the second odd gate signal G2a with phases different from each other to the first gate line GL1 and the second gate line GL2, respectively, through the two output terminals. Referring to FIG. 2, in an embodiment, the second odd gate signal G2a may be output after the first odd gate signal G1a is output.

The second odd stage 10b may be connected to one side of the third gate line GL3 and to one side of the fourth gate line GL4. The second odd stage 10b may include two output terminals, and may provide a third odd gate signal G3a and a fourth odd gate signal G4a with phases different from each other to the third gate line GL3 and the fourth gate line GL4, respectively, through the two output terminals. Referring to FIG. 2, in an embodiment, the fourth odd gate signal G4a may be output after the third odd gate signal G3a is output.

In another embodiment, the second odd stage 10b may be dependently connected to the first odd stage 10a. Therefore, after the second odd gate signal G2a is output, the third odd gate signal G3a may be output. That is, referring to FIG. 2, the first to fourth odd gate signals G1a to G4a may be sequentially output.

The second gate driving circuit 20 may include a plurality of even stages (20a, 20b, 20c . . . ). Hereinafter, the explanation will be provided on the basis of the first even stage 20a and the second even stage 20b, among the plurality of even stages (20a, 20b, 20c . . . ).

The first even stage 20a may be connected to another side/second side of a first dummy gate line GLd1 and the other side of the first gate line GL1. Here, the first dummy gate line GLd1 is a gate line that is not connected to the plurality of pixels PX. The first even stage 20a may include two output terminals, and may provide the first even gate signal G0b and the second even gate signal G1b with phases different from each other to the first dummy gate line GLd1 and the first gate line GL1, respectively, through the two output terminals. Referring to FIG. 2, in an embodiment, a second even gate signal G1b may be output after the first even gate signal G0b is output.

The second even stage 20b may be connected to the other side of the second gate line GL2 and to an other side of the third gate line GL3. The second even stage 20b may include two output terminals, and may provide the third even gate signal G2b and the fourth even gate signal G3b with differing phases to the second gate line GL2 and to the third gate line GL3, respectively, through the two output terminals. Referring to FIG. 2, in an embodiment, the fourth even gate signal G3b may be output after the third even gate signal G2b is output. That is, referring to FIG. 2, the first to fourth even gate signals G0b to G3b may be sequentially output.

A plurality of odd stages (10a, 10b, 10c . . . ) may cross the plurality of even stages (20a, 20b, 20c . . . ). The description will be provided in detail with reference to the first gate line GL1 and the second gate line GL2.

Of the two output terminals of the first odd stage 10a, one side of the first gate line GL1 may be connected to the output terminal from which the first odd gate signal G1a having a relatively rapid phase is output. On the other hand, of the two output terminals of the first even stage 20a, the other side of the first gate line GL1 may be connected to the output terminal from which a second even gate signal G1b having a relatively slow phase is output. Referring to FIG. 2, the first odd gate signal G1a may have the same phase as the second even gate signal G1b.

That is, the first odd stage 10a and the first even stage 20a may include output terminals that output two gate signals with phases different from each other. The output terminal of the first odd stage 10a from which the first odd gate signal G1a having a relatively rapid phase is output, and the output terminal of the first even stage 20a from which the second even gate signal G1b having a relatively slow phase is output, may both be connected to the same first gate line GL1.

Further, the second gate line GL2 may be connected both to the output terminal of the first odd stage 10a from which the second odd gate signal G2a having a relatively slow phase is output, and to the output terminal of the second even stage 20b from which the third even gate signal G2b having the relatively rapid phase is output.

Therefore, by including a stage having two output terminals, a single stage may be connected to two gate lines. As a result, it is possible to sufficiently secure a space in which the first gate driving circuit 10 and the second gate driving circuit 20 may be integrated, and the bezel width of the display panel 1 may be reduced accordingly.

On the other hand, because the gate signals are provided to both sides of a single gate line, display quality can be improved due to improvement in an RC delay phenomenon.

On the other hand, among the plurality of odd stages (10a, 10b, 10c . . . ) included in the first gate driving circuit 10, the stage located at a lowermost position in FIG. 1 may be connected to a second dummy gate line GLd2.

Also, FIG. 1 illustrates a configuration in which one of the output terminals of the first even stage 20a may be connected to the first dummy gate line GLd1, and a stage located at the lowermost position based on FIG. 1 among the plurality of odd stages (10a, 10b, 10c . . . ) is connected to the second dummy gate line GLd2, but the present invention is not limited thereto. For example, one of the output terminals of the first odd stage 10a may be connected to the first dummy gate line GLd1, and the even stage located at the lowermost position in FIG. 1 among the plurality of even stages (20a, 20b, 20c . . . ) may be connected to the second dummy gate line GL2d.

Figure 3:
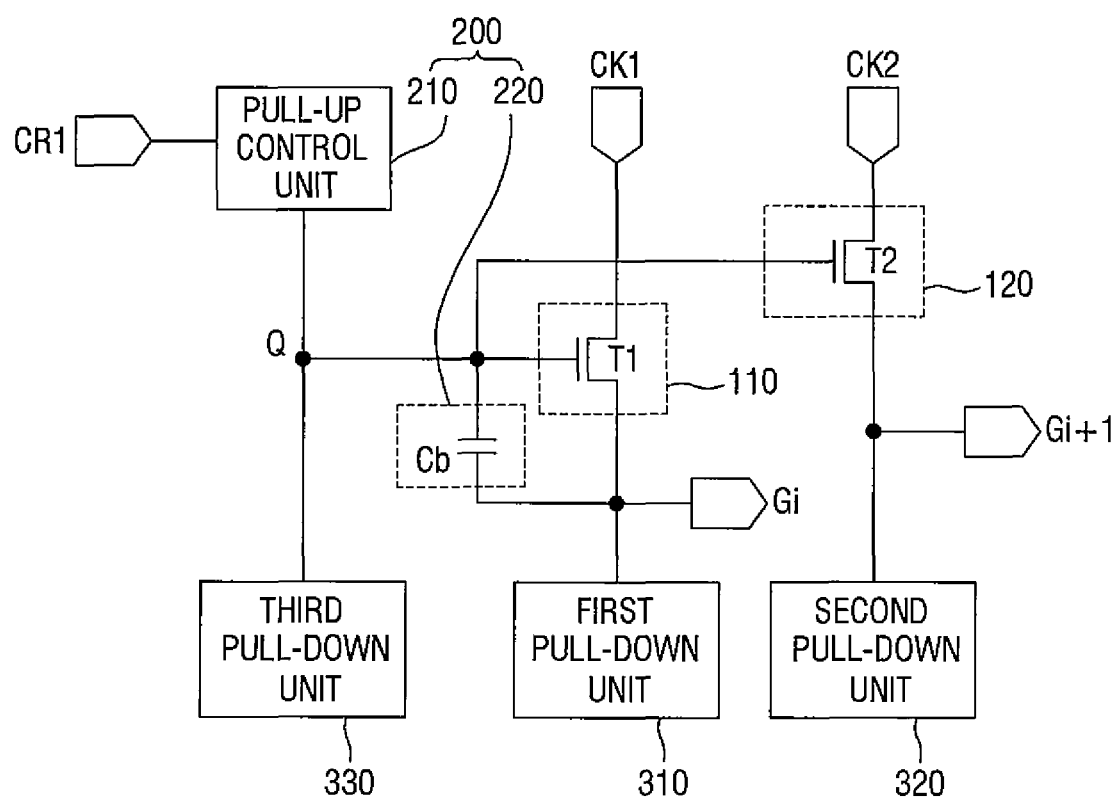
FIG. 3 is a diagram schematically illustrating an embodiment of a stage in the configuration of the gate driving circuit illustrated in FIG. 1.
Figure 4:
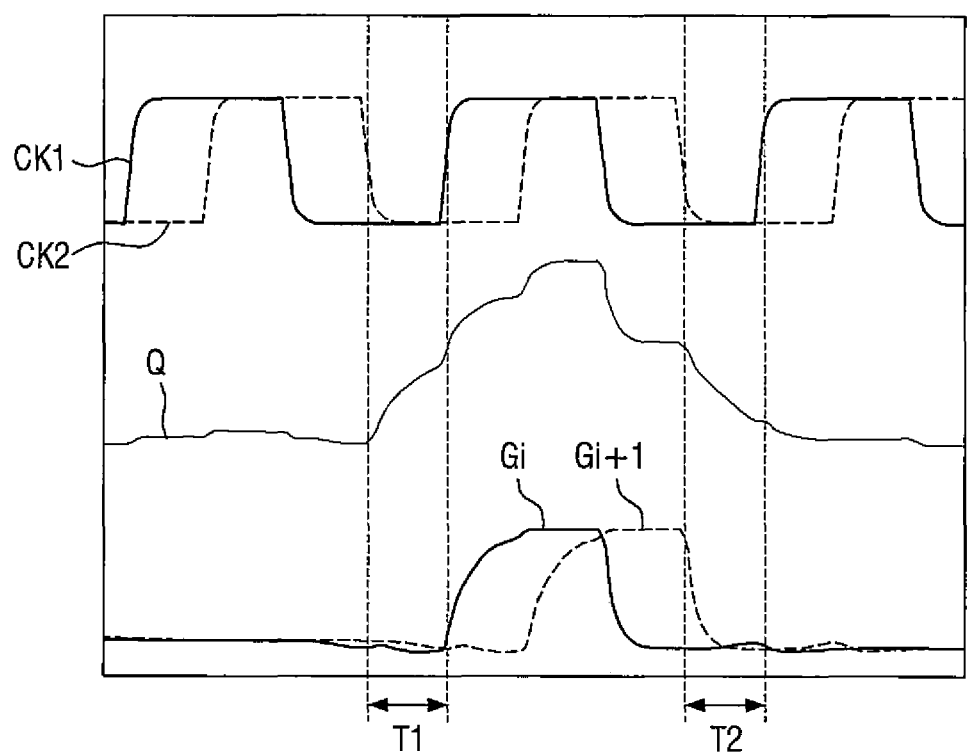
FIG. 4 is a waveform diagram for explaining a potential change of a control node in the stage illustrated in FIG. 3.

FIG. 3 is a diagram schematically illustrating an embodiment of a stage in the configuration of the gate driving circuit illustrated in FIG. 1. FIG. 4 is a waveform diagram for explaining the potential change of the control node of the stage illustrated in FIG. 3. The stage illustrated in FIG. 3 and FIG. 4 may be one of a plurality of odd stages (10a, 10b, 10c . . . ) included in the first gate driving circuit 10 or of a plurality of even stages (20a, 20b, 20c . . . ) included in the second gate driving circuit 20. Hereinafter, an i-th stage connected to an i-th gate line GLi (i is a natural number of 1 or more) and to an i+1th gate line GLi+1 will be described as an example.

Referring to FIG. 3, the i-th stage may include a first pull-up portion 110, a second pull-up portion 120, and a controller 200.

The first pull-up portion 110 may output the first clock signal CK1 as the i-th gate signal Gi in accordance with the signal provided to the control node Q. The first pull-up portion 110 may include a first transistor (e.g., a first pull-up transistor) T1 in the present embodiment. The first transistor T1 may include a gate electrode/control terminal connected to a control node Q, a source electrode that receives a first clock signal CK1, and a drain electrode that outputs the i-th gate signal Gi. In an embodiment, the first pull-up portion 110 may provide the i-th gate signal Gi to the i-th gate line.

The second pull-up portion 120 may output a second clock signal CK2 as the i+1th gate signal Gi+1 in accordance with the signal provided to the control node Q. The second pull-up portion 120 may include a second transistor (e.g., a second pull-up transistor) T2 in the present embodiment. The second transistor T2 may include a gate electrode connected to the control node Q, a source electrode that receives the second clock signal CK2, and a drain electrode that outputs the i+1th gate signal Gi+1. In an embodiment, the second pull-up portion 120 may provide the i+1th gate signal Gi+1 to the i+1th gate line. Here, the i+1th gate line is a gate line that is located at a next stage that follows the i-th gate line.

The first pull-up portion 110 and the second pull-up portion 120 may share the control node Q. Also, the first clock signal CK1 may have a phase that is different from that of the second clock signal CK2. As a result, the i-th gate signal Gi may have phase that is different from that of the i+1th gate signal Gi+1.

In an embodiment, the first clock signal CK1 may have a phase that is relatively faster than that of the second clock signal CK2. As a result, the i-th gate signal Gi has a phase that is relatively faster than the i+1th gate signal Gi+1, and the i-th gate signal Gi may be output relatively earlier.

The controller 200 may include a pull-up controller (e.g., pull-up control unit) 210 and a control capacitor Cb (e.g., a control capacitance portion) 220). The pull-up controller 210 may provide the first carry signal CR1 provided from one of the previous stages to the control node Q. In an embodiment, the first carry signal CR1 may be the i−1th gate signal Gi−1 provided from the i−1th stage.

The pull-up controller 210 may be connected to a terminal that provides the first carry signal CR1, and to the control node Q. That is, by providing the first carry signal CR1 to the control node Q, the pull-up controller 210 may control the operations of the first pull-up portion 110 and the second pull-up portion 120.

One electrode of the control capacitor Cb may be connected to the gate electrode of the first transistor T1, and the other electrode of the control capacitor Cb may be connected to the drain electrode of the first transistor T1.

The i-th stage may further include a first pull-down portion (e.g., first pull-down unit) 310, a second pull-down portion (e.g., second pull-down unit) 320, and a third pull-down portion (e.g., third pull-down unit) 330.

The first pull-down portion 310 may be connected to the drain electrode of the first transistor T1. The first pull-down portion 310 may pull down a voltage of the output terminal, from which the i-th gate signal Gi is output, to a predetermined voltage. The second pull-down portion 320 may be connected to the drain electrode of the second transistor T2. The second pull-down portion 320 may pull down a voltage of the output terminal, from which the i+1th gate signal Gi+1 is output, to a predetermined voltage. The third pull-down portion 330 may be connected to the control node Q. The third pull-down portion 330 may pull down a voltage of the control node Q to a predetermined voltage.

With reference to FIG. 4, the potential change of the control node Q will be described.

A rising section T1 means a section in which the potential of the control node Q increases (e.g., increases to a predetermined level). As the first carry signal CR1 of a high level is provided to the pull-up controller 210 from the previous stage during the rising section T1, the pull-up controller 210 may apply the provided first carry signal CR1 to the control node Q. As a result, the potential of the control node Q increases (e.g., increases to a predetermined level).

A falling section T2 means a section in which the potential of the control node Q decreases again. During the falling section T2, the potential of the control node Q may be pulled down by the third pull-down portion 330. As a result, the potential of the control node Q decreases again (e.g., decreases to a predetermined level).

On the other hand, each of the i-th gate signal Gi and the i+1th gate signal Gi+1, which have phases that are different from each other, may be in a high level between the rising section T1 and the falling section T2. This means that the i-th gate signal Gi and the i+1th gate signal Gi+1 are output between the rising section T1 and the falling section T2. The i-th gate signal Gi may be output relatively earlier than the i+1th gate signal Gi+1.

That is, while the control node Q has the rising section T1 and the falling section T2, the gate driving circuit according to the present embodiment may sequentially output the two gate signals with phases that are different from each other.

Figure 5:
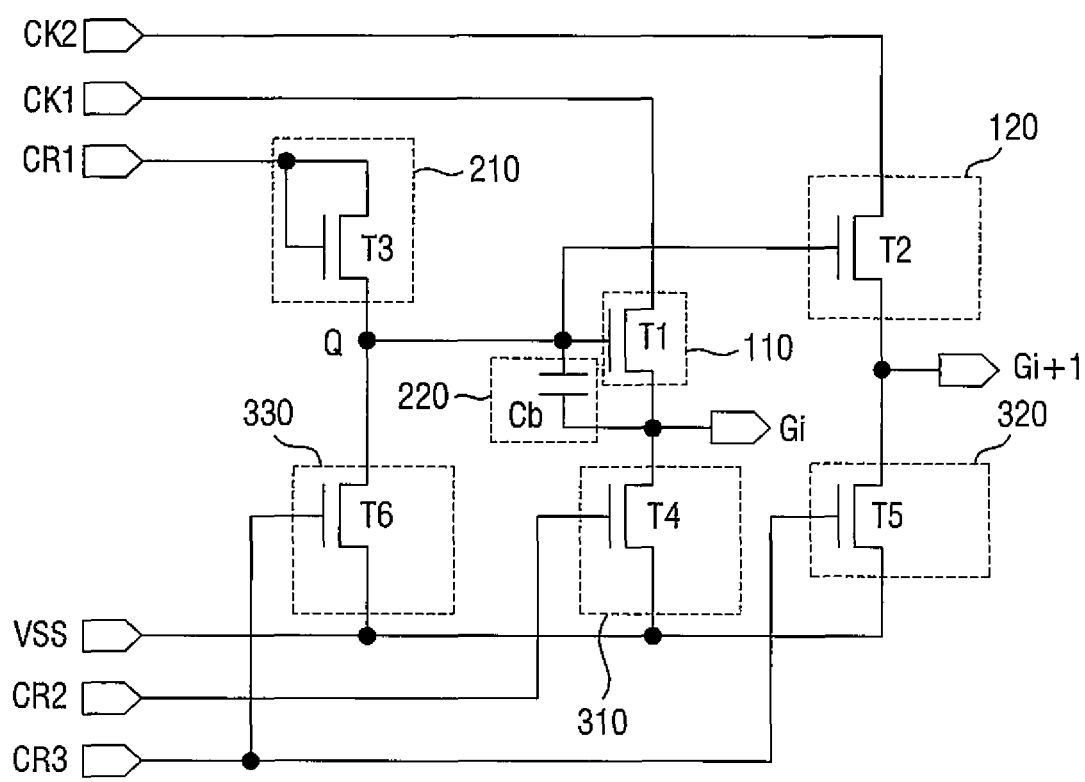
FIG. 5 is an equivalent circuit diagram illustrating an embodiment of the stage illustrated in FIG. 3 in more detail.
Figure 6:
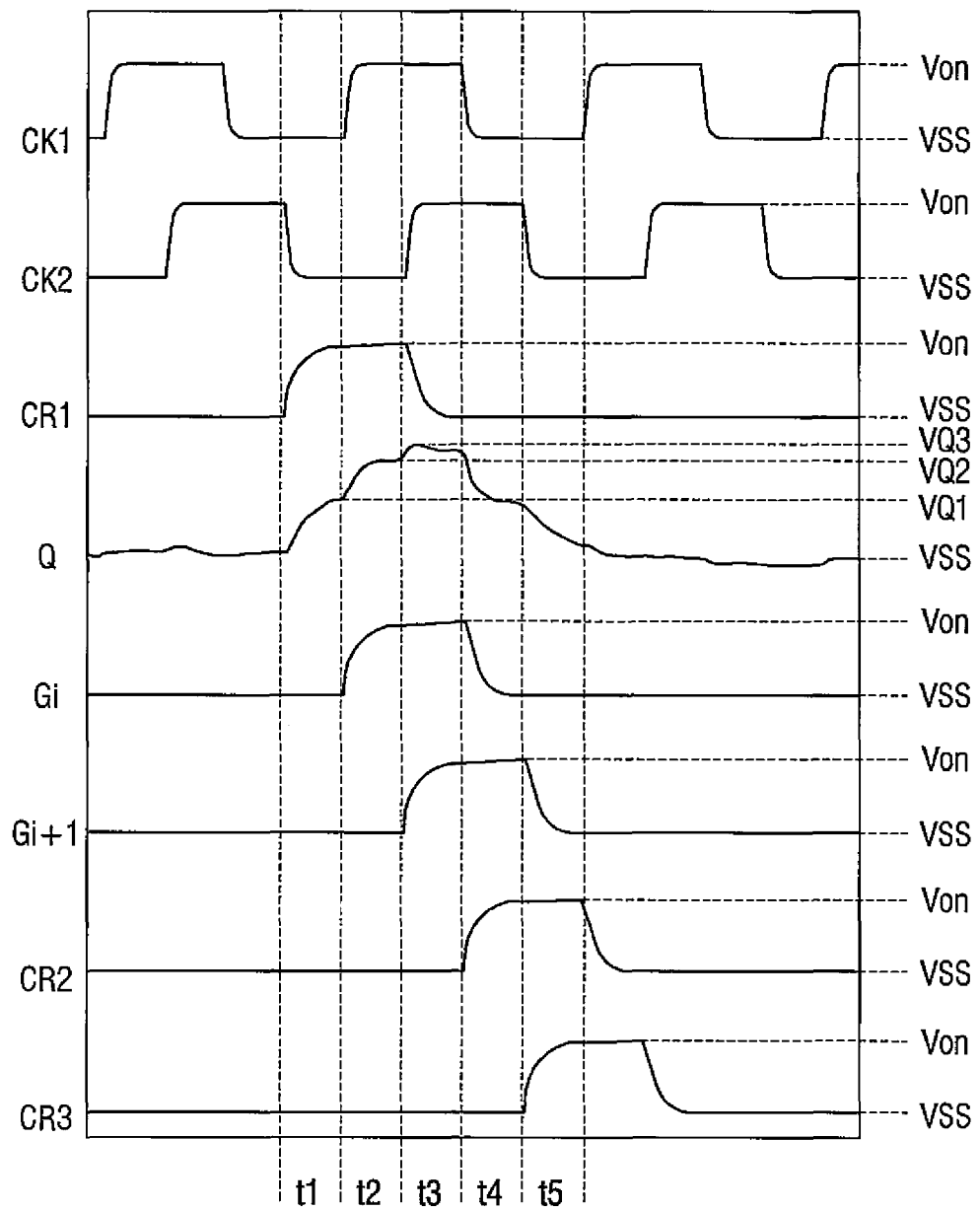
FIG. 6 is a waveform diagram for explaining the operation of the stage illustrated in FIG. 5.

FIG. 5 is an equivalent circuit diagram illustrating an embodiment of the stage illustrated in FIG. 3 in more detail. FIG. 6 is a waveform diagram for explaining the operation of the stage illustrated in FIG. 5. However, repeated description of FIG. 3 will not be provided.

Referring to FIG. 5, the pull-up controller 210 may include a third transistor (e.g., a control transistor) T3. The third transistor T3 may include a gate electrode and a source electrode that receive the first carry signal CR1, and a drain electrode that is connected to the control node Q. That is, the third transistor T3 may be a diode-connected transistor in which the gate electrode and the source electrode are connected to each other. The first carry signal CR1 may be a vertical start signal when the i-th stage is the first stage. That is, the pull-up controller 210 may provide the first carry signal CR1 to the control node Q based on the first carry signal CR1 provided from the previous stage. Thus, the operations of the first pull-up portion 110 and the second pull-up portion 120 may be controlled.

The first pull-down portion 310 may include a fourth transistor (e.g., a first pull-down transistor) T4. The fourth transistor T4 may include a gate electrode that receives the second carry signal CR2, a source electrode that provides the off-voltage VSS, and a drain electrode connected to the output terminal of the i-th gate signal Gi. Here, the second carry signal CR2 may be a signal that is provided from the next stage, and for example, may be a i+2th gate signal Gi+2.

That is, the first pull-down portion 310 may apply an off-voltage VSS to the output terminal of the i-th gate signal Gi in accordance with the second carry signal CR2. As a result, the output terminal of the i-th gate signal Gi may be pulled down to the off-voltage VSS.

The second pull-down portion 320 may include a fifth transistor (e.g., a second pull-down transistor) T5. The fifth transistor T5 may include a gate electrode that receives the third carry signal CR3, a source electrode that provides the off-voltage VSS, and a drain electrode connected to the output terminal of the i+1th gate signal Gi+1. Here, the third carry signal CR3 may be a signal provided from the next stage, and may be a signal that is different in phase from the second carry signal CR2. For example, the third carry signal CR3 may be an i+3th gate signal Gi+3, and thus, the third carry signal CR3 may be applied to the gate electrode of the fifth transistor T5 to be relatively slower than the second carry signal CR2.

That is, the second pull-down portion 320 may apply the off-voltage VSS to the output terminal of the i+1th gate signal Gi+1 in accordance with the third carry signal CR3. As a result, the output terminal of the i+1th gate signal Gi+1 may be pulled down to the off-voltage VSS.

The third pull-down portion 330 may include a sixth transistor (e.g., third pull-down transistor) T6. The sixth transistor T6 may include a gate electrode that receives the third carry signal CR3, a source electrode that provides the off-voltage VSS, and a drain electrode connected to the control node Q.

That is, the third pull-down portion 330 may apply the off-voltage VSS to the control node Q in accordance with the third carry signal CR3. As a result, the control node Q may be pulled down to the off-voltage VSS.

With reference to FIG. 6, the operation of the i-th stage illustrated in FIG. 5 will be described.

First, in the first section t1, the pull-up controller 210 receives the first carry signal CR1 of the high level, and may apply the first carry signal CR1 to the control node Q. More specifically, the third transistor T3 may be turned on in accordance with the first carry signal CR1 to output the first carry signal CR1 to the control node Q. As a result, the potential of the control node Q rises to the first voltage VQ1. Further, a voltage (e.g., a predetermined voltage) is charged to the control capacitor Cb.

Thereafter, in the second section t2, as the first clock signal CK1 of the low level is inverted to a high level, the first pull-up portion 110 may output the first clock signal CK1 as the i-th gate signal Gi. More specifically, as a voltage (e.g., a predetermined voltage) is charged to the control capacitor Cb, the first transistor T1 is turned on, and may output the first clock signal CK1 as the i-th gate signal Gi. As the potential of the output terminal of the i-th gate signal Gi rises, the potential of the control node Q rises to the second voltage VQ2 from the first voltage VQ1 due to coupling with the control capacitor Cb.

Next, in the third section t3, as the second clock signal CK2 of the low level is inverted to the high level, the second pull-up portion 120 outputs the second clock signal CK2 as the i+1th gate signal Gi+1. More specifically, as the control capacitor Cb is charged with a voltage (e.g., a predetermined voltage), the second transistor T2 is turned on, and may output the second clock signal CK2 as the i+1th gate signal Gi+1. Due to coupling of the parasitic capacitors between the second clock signal CK2 and the second transistor T2, the potential of the control node Q rises to the third voltage VQ3 from the second voltage VQ2.

The first to third sections t1, t2, and t3 are sections in which the i-th gate signal Gi and the i+1th gate signal Gi+1 are converted from the low level to the high level, and finally, the i-th gate signal Gi and the i+1th gate signal Gi+1 are sequentially output.

In the fourth section t4, the first pull-down portion 310 may pull down the output terminal of the i-th gate signal Gi to the off-voltage VSS in accordance with the second carry signal CR2. More specifically, the fourth transistor T4 may be turned on in accordance with the second carry signal CR2 to provide the off-voltage VSS to the output terminal of the i-th gate signal Gi. As a result, the output terminal of the i-th gate signal Gi is pulled down to the off-voltage VSS. Further, as the electric charge that is charged in the control capacitor Cb is partially discharged, the potential of the control node Q falls to the first voltage VQ1.

Next, in the fifth section t5, the second pull-down portion 320 may pull down the output terminal of the i+1th gate signal Gi+1 to the off-voltage VSS in accordance with the third carry signal CR3. In addition, the third pull-down portion 330 may pull down the control node Q to the off-voltage VSS in accordance with the third carry signal CR3. More specifically, the fifth transistor T5 may be turned on in accordance with the third carry signal CR3 to provide the off-voltage VSS to the output terminal of the i+1th gate signal Gi+1. As a result, the output terminal of the i+1th gate signal Gi+1 is pulled down to the off-voltage VSS. Further, the sixth transistor T6 may be turned on in accordance with the third carry signal CR3 to provide the off-voltage VSS to the control node Q. As a result, the control node Q is pulled down to the off-voltage VSS. In this process, the potential of the control node Q falls to the off-voltage VSS, and the control capacitor Cb may be discharged to the off-voltage VSS.

Referring to the table below, it is possible to understand that the display device including the gate driving circuit according to the present embodiment has a lower deviation between one side of the gate line and the other side of the gate line, as compared to the related art. That is, embodiments of the present invention are able to reduce the delay of the gate signal by reducing the RC delay of the gate line. As a result, it is possible to improve the display quality of the display device. On the other hand, the related art refers to a display device having a gate driver that provides a single gate signal to a single gate line.

TABLE

| | Gate delay | | |
|---|---|---|---|
| | Left (us) | Right (us) | Deviation (us) |
| Prior Art | 0.827 | 0.944 | 0.117 |
| Embodiments of the present invention | 0.795 | 0.828 | 0.033 |

On the other hand, the display device according to an embodiment of the present invention includes a gate driving circuit having stages that output gate signals to the two gate lines via two corresponding output terminals, thereby making it possible to reduce the integration area of the gate driving circuit, and to thereby reduce the bezel of the display panel (e.g., display panel 1 in FIG. 1).

Figure 7:
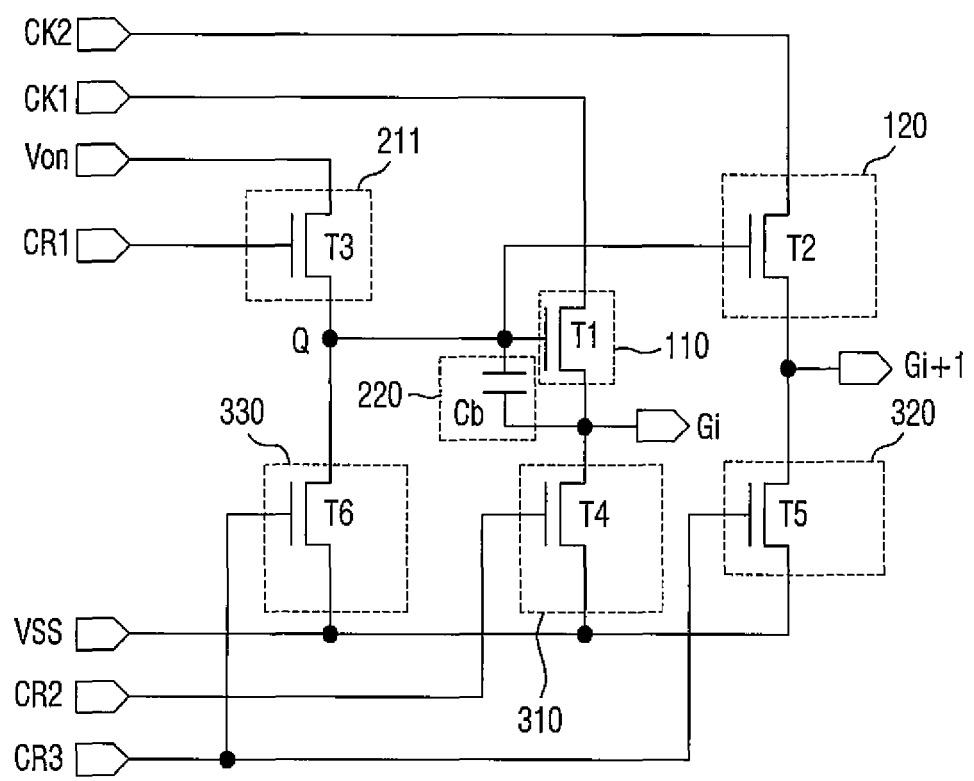
FIG. 7 is an equivalent circuit diagram illustrating another embodiment of the gate driving circuit illustrated in FIG. 3.

FIG. 7 is an equivalent circuit diagram illustrating another embodiment of the gate driving circuit illustrated in FIG. 3. Repeated descriptions of FIGS. 3 to 6 will not be provided. In addition, another embodiment of the same configuration will be referenced by differently denoting only the reference numerals/characters.

Referring to FIG. 7, a pull-up controller 211 may include a third transistor T3 that includes a source electrode that receives an on-voltage Von. That is, in the third transistor T3, the gate electrode and the source electrode are not connected to each other, and the third transistor T3 may independently receive the on-voltage Von of a DC component via the source electrode.

Figure 8:
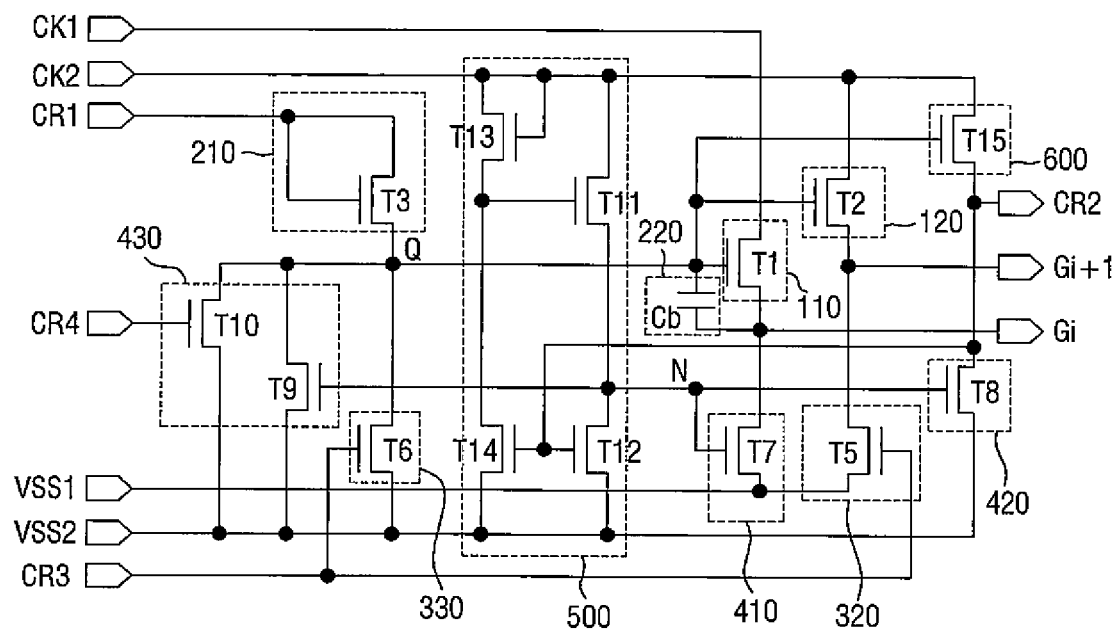
FIG. 8 is an equivalent circuit diagram illustrating a gate driving circuit according to another embodiment of the present invention.
Figure 9:
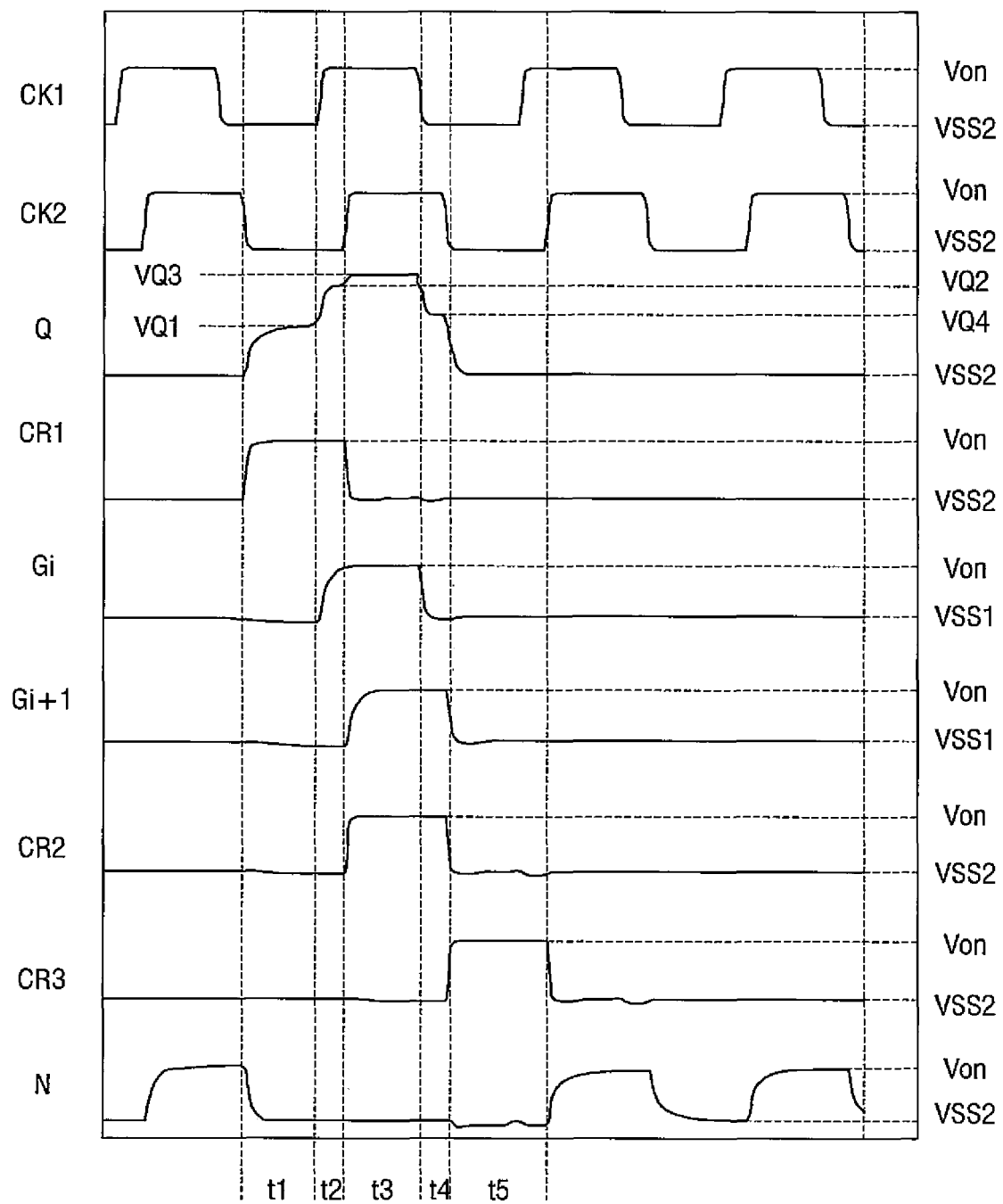
FIG. 9 is a waveform diagram for explaining the operation of the gate driving circuit illustrated in FIG. 8.

FIG. 8 is an equivalent circuit diagram illustrating a gate driving circuit according to another embodiment of the present invention. FIG. 9 is a waveform diagram for explaining the operation of the gate driving circuit illustrated in FIG. 8. Repeated descriptions of FIGS. 3 to 6 will not be provided. In addition, another embodiment of the same configuration will be referenced by differently denoting only the reference numerals/characters.

Referring to FIGS. 8 and 9, a first carry signal CR1 provided to the gate electrode of the third transistor T3 may be a signal provided from an i−2th stage in the present embodiment. Further, a third carry signal CR3 provided to the fifth transistor T5 and the sixth transistor T6 may be a signal provided from an i+3$^{rd}$ stage.

The i-th stage may further include a first holding portion 410, a second holding portion 420, a third holding portion 430, an inverter 500, and a carry portion 600.

The first holding portion 410 may include a seventh transistor T7. The seventh transistor T7 may include a gate electrode connected to an inverting node N, a source electrode that receives a first off-voltage VSS1, and a drain electrode connected to the output terminal of the i-th gate signal Gi. The seventh transistor T7 may be turned on in accordance with a voltage applied to the inverting node N to provide the first off-voltage VSS1 to the output terminal of the i-th gate signal Gi. As a result, the i-th gate signal Gi may be held at the first off-voltage VSS1.

The second holding portion 420 may include an eighth transistor T8. The eighth transistor T8 may include a gate electrode connected to the inverting node N, a source electrode that receives a second off-voltage VSS2, and a drain electrode connected to the output terminal of the second carry signal CR2. The eighth transistor T8 may be turned on in accordance with the voltage applied to the inverting node N to provide the second off-voltage VSS2 to the output terminal of the second carry signal CR2. As a result, the second carry signal CR2 may be held at the second off-voltage VSS2. Here, the second carry signal CR2 may be a signal provided to the i+1th stage.

The third holding portion 430 may include ninth and tenth transistors T9 and T10. The ninth transistor T9 may include a gate electrode connected to the inverting node N, a source electrode that receives the second off-voltage VSS2, and a drain electrode connected to the control node Q. The tenth transistor T10 may include a gate electrode that receives the fourth carry signal CR4, a source electrode that receives the second off-voltage VSS2, and a drain electrode connected to the control node Q. Here, the fourth carry signal CR4 may be provided from the next stage of the i-th stage, and may be provided from an i+4$^{th}$ stage. The ninth transistor T9 may be turned on in accordance with the voltage applied to the inverting node N to provide the second off-voltage VSS2 to the control node Q. In addition, the tenth transistor T10 may be turned on in accordance with the fourth carry signal CR4 to provide the second off-voltage VSS2 to the control node Q. As a result, the control node Q may be held at the second off-voltage VSS2. Further, the potential of the control node Q may be stabilized at the second off-voltage VSS2. As a result, the leakage current of the first transistor T1 may be reduced, and it is possible to prevent the first transistor T1 from being abnormally turned on at a high temperature. In addition, it is possible to reduce the ripple component of the control node Q.

The inverter 500 may include an eleventh transistor T11, a twelfth transistor T12, a thirteenth transistor T13, and a fourteenth transistor T14. The eleventh transistor T11 may include a gate electrode connected to a drain electrode of the thirteenth transistor T13, a source electrode that receives the second clock signal CK2, and a drain electrode connected to the inverting node N. The twelfth transistor T12 may be connected in series with the eleventh transistor T11. The twelfth transistor T12 may include a gate electrode connected to a gate electrode of the fourteenth transistor T14 and to the drain electrode of the eighth transistor T8, a source electrode connected to the second off-voltage stage VSS2, and a drain electrode connected to the inverting node N. The thirteenth transistor T13 may include a source electrode that receives the second clock signal CK2, a gate electrode connected to the source electrode, and a drain electrode connected to the gate electrode of the eleventh transistor T11. The fourteenth transistor T14 may be connected in series with the thirteenth transistor T13. The fourteenth transistor T14 may include a gate electrode connected to the gate electrode of the twelfth transistor T12 and to the drain electrode of the eighth transistor T8, a drain electrode connected to the drain electrode of the thirteenth transistor T13, and a source electrode that receives the second off-voltage VSS2.

As the inverter 500 is connected with the inverting node N, the inverter 500 may control the operation of the first to third holding portions 410, 420, and 430. The inverter 500 provides the second off-voltage VSS2 to the inverting node N in response to the second clock signal CK2, thereby making it possible to turn off each of the transistors T7, T8, and T9 included in the first through third holding portions 410, 420, 430.

The carry portion 600 may output the second clock signal CK2 as the second carry signal CR2 in accordance with the signal applied to the control node Q. The carry portion 600 may include a fifteenth transistor T15. The fifteenth transistor T15 may include a gate electrode connected to the control node Q, a source electrode that receives the second clock signal CK2, and a drain electrode that outputs the second carry signal CR2. As described above, the second carry signal CR2 may be provided to the i+1th stage. On the other hand, by separating the output terminal from which the i-th gate signal Gi is output, and the output terminal from which the second carry signal CR2 is output, it is possible to reduce the delay of signal transmission for each stage, and to improve stability at low temperature.

First, in the first section t1, the pull-up controller 210 may receive the first carry signal CR1 of the high level to apply the first carry signal CR1 to the control node Q. More specifically, the third transistor T3 may be turned on in accordance with the first carry signal CR1 to output the first carry signal CR1 to the control node Q. As a result, the potential of the control node Q rises to the first voltage VQ1. Further, a voltage (e.g., a predetermined voltage) is charged to the control capacitor Cb.

Thereafter, in the second section t2, as the first clock signal CK1 of the low level is inverted to a high level, the first pull-up portion 110 may output the first clock signal CK1 as the i-th gate signal Gi. More specifically, when a voltage (e.g., a predetermined voltage) is charged to the control capacitor Cb, the first transistor T1 is turned on and may output the first clock signal CK1 as the i-th gate signal Gi. On the other hand, as the potential of the output terminal of the i-th gate signal Gi rises, the potential of the control node Q rises to the second voltage VQ2 from the first voltage VQ1 by the coupling with the control capacitor Cb.

Next, as the second clock signal CK2 of the low level is inverted to the high level in the third section t3, the second pull-up portion 120 may output the second clock signal CK2 as the i+1th gate signal Gi+1. More specifically, when the control capacitor Cb is charged with a voltage (e.g., a predetermined voltage), the second transistor T2 is turned on and may output the second clock signal CK2 as the i+1th gate signal Gi+1. Further, when charging the control capacitor Cb (e.g., with a predetermined voltage), the fifteenth transistor T15 is turned on and may output the second clock signal CK2 as the second carry signal CR2. On the other hand, due to the coupling of the parasitic capacitors between the second clock signal CK2 and the second transistor T2, the potential of the control node Q rises to the third voltage VQ3 from the second voltage VQ2.

The first to third sections t1 to t3 are sections in which the i-th gate signal Gi and the i+1th gate signal Gi+1 are converted from the low level to the high level, and finally, the i-th gate signal Gi and the i+1th gate signal Gi+1 are sequentially output.

In the fourth section t4, the first clock signal CK1 may be converted to the low level from the high level. The potential of the first clock signal CK1 falls to the second off-voltage VSS2. Accordingly, the first clock signal CK1 having the potential of the second off-voltage VSS2 may be provided from the first transistor T1 to the output terminal of the i-th gate signal Gi. As a result, the potential of the output terminal of the i-th gate signal Gi decreases to the second off-voltage VSS2. That is, the gate driving circuit according to another embodiment of the present invention does not include another pull-down transistor. In addition, as the electric charge charged to the control capacitor Cb is partially discharged, the potential of the control node Q falls to a fourth voltage VQ4.

Next, in the fifth section t5, the second pull-down portion 320 may pull down the output terminal of the i+1th gate signal Gi+1 to the second off-voltage VSS2 in accordance with the third carry signal CR3. In addition, the third pull-down portion 330 may pull down the control node Q to the second off-voltage VSS2 in accordance with the third carry signal CR3. More specifically, the fifth transistor T5 may be turned on in accordance with the third carry signal CR3 to provide the second off-voltage VSS2 to the output terminal of the i+1th gate signal Gi+1. As a result, the output terminal of the i+1th gate signal Gi+1 is pulled down to the second off-voltage VSS2. In addition, the sixth transistor T6 may be turned on in accordance with the third carry signal CR3 to provide the second off-voltage VSS2 to the control node Q. As a result, the control node Q is pulled down to the second off-voltage VSS2. In this process, the potential of the control node Q falls to the second off-voltage VSS2, and the control capacitor Cb may be discharged to the second off-voltage VSS2.

The first holding portion 410 may periodically hold the output terminal of the i-th gate signal Gi at the first off-voltage VSS1 each time a high level signal (e.g., the on-voltage Von) is supplied to the inverting node N. In addition, each of the second holding portion 420 and the third holding portion 430 may periodically hold the output terminal of the second carry signal CR2 and the control node Q at the second off-voltage VSS2, each time the on-voltage Von is supplied to the inverting node N. On the other hand, the inverter 500 may provide the second off-voltage VSS2 to the first to third holding portions 410, 420, and 430 in accordance with the second clock signal CK2 to control the operation of the first to third holding portions 410, 420, and 430.

Figure 10:
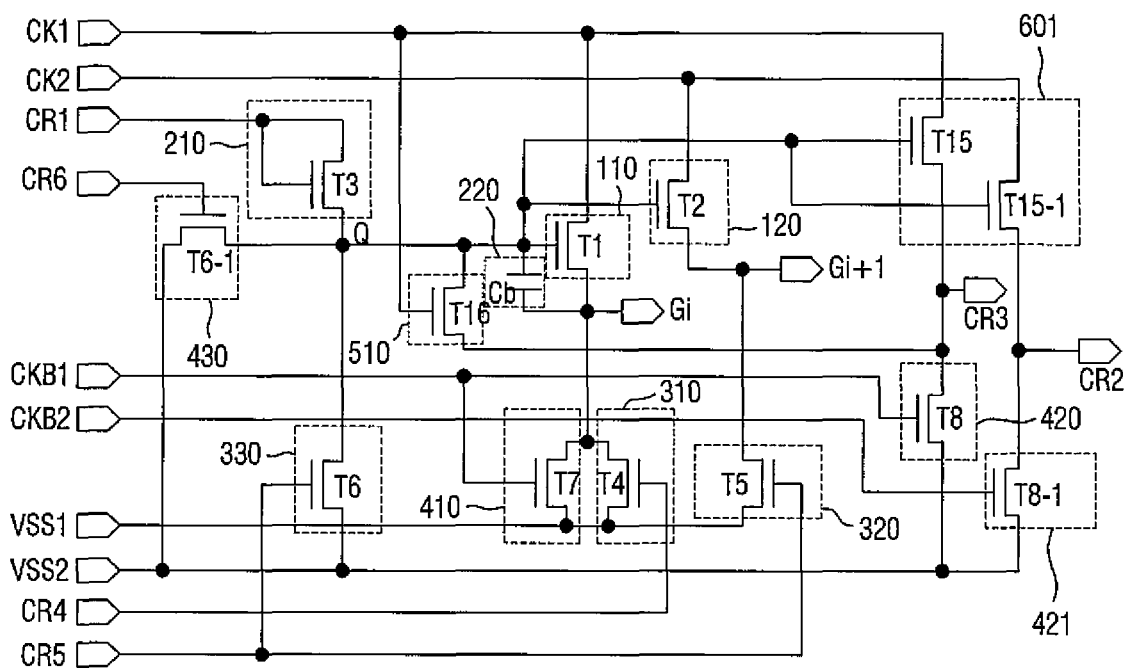
FIG. 10 is an equivalent circuit diagram illustrating a gate driving circuit according to another embodiment of the present invention.
Figure 11:
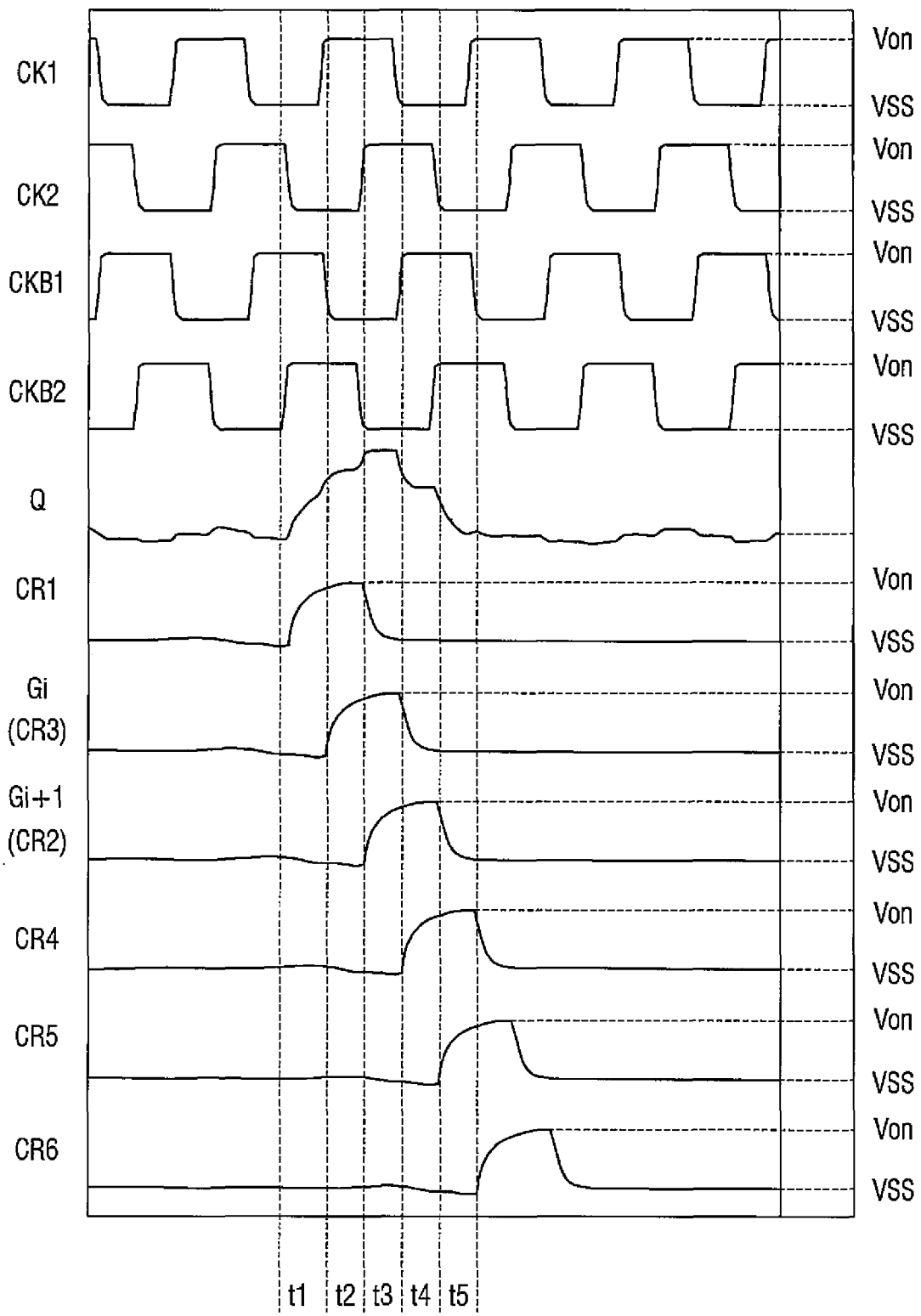
FIG. 11 is a waveform diagram for explaining the operation of the gate driving circuit illustrated in FIG. 10.

FIG. 10 is an equivalent circuit diagram illustrating a gate driving circuit according to still another embodiment of the present invention. FIG. 11 is a waveform diagram for explaining the operation of the gate driving circuit illustrated in FIG. 10. Repeated descriptions of FIGS. 3 to 6, 8, and 9 will not be provided. In addition, another embodiment of the same configuration will be referred by differently denoting only the reference numerals/characters.

Referring to FIGS. 10 and 11, the first pull-down portion 310 may include a fourth transistor T4 that is turned on in accordance with a fourth carry signal CR4 to provide the first off-voltage VSS1 to the output terminal of the i-th gate signal Gi. Here, the fourth carry signal CR4 may be a carry signal provided from one of subsequent stages, and may be a signal provided from the i+2th stage.

The second pull-down portion 320 may include a fifth transistor T5 that is turned on in accordance with a fifth carry signal CR5 to provide the first off-voltage VSS1 to the output terminal of the i-th gate signal Gi+1. Here, the fifth carry signal CR5 may be a carry signal provided from a subsequent one of the stages, and may be a signal provided from the i+3$^{rd}$ stage. In addition, the third pull-down portion 330 may be turned on in accordance with a fifth carry signal CR5 to provide the second off-voltage VSS2 to the control node Q.

The first holding portion 410 may include a seventh transistor T7 including a gate electrode that receives the first gate on-signal CKB1. The first gate on-signal CKB1 may be a signal provided from an external terminal. The second holding portion 420 may include an eighth transistor T8 including a gate electrode that receives the first gate on-signal CKB1. The eighth transistor T8 is turned on by receiving the first gate signal CKB1, and provides the second off-voltage VSS2 to the output terminal of the third carry signal CR3, thereby making it possible to hold the output terminal of the third carry signal CR3 at the second off-voltage VSS2. Here, the third carry signal CR3 may be a signal provided to a subsequent stage, and may be a signal provided to the i+1th stage.

The third holding portion 430 may include a 6-1th transistor T6-1 including a gate electrode that receives the sixth carry signal CR6. Here, the sixth carry signal CR6 may be a signal provided to a subsequent stage, and may be a signal that is provided to the i+4$^{th}$ stage.

The i-th stage may further include a fourth holding portion 421. The fourth holding portion 421 may include a 8-1th transistor T8-1. The 8-1th transistor T8-1 may include a gate electrode that receives a second gate on-signal CKB2, a source electrode that receives the second off-voltage VSS2, and a drain electrode connected to the output terminal of the second carry signal CR2. The 8-1th transistor T8-1 may be turned on in accordance with the second gate on-signal CKB2 to provide the second off-voltage VSS2 to the output terminal of the second carry signal CR2, thereby making it possible to hold the output terminal of the second carry signal CR2 at the second off-voltage VSS2. Here, the second carry signal CR2 may be a signal provided to the next stage. The second gate on-signal CKB2 is a signal having a phase that is different from that of the first gate on-signal CKB1. More specifically, the second gate on-signal CKB2 may be a signal having a phase that is relatively slower than, or delayed from, the phase of the first gate on-signal CKB1.

Also, the i-th stage may include a first pull-down portion 310. The first pull-down portion 310 may include a fourth transistor T4. The fourth transistor T4 may include a gate electrode that receives the fourth carry signal CR4, a source electrode that receives the first off-voltage VSS1, and a drain electrode connected to the output terminal of the i-th gate signal Gi. The first pull-down portion 310 may apply the first off-voltage VSS1 to the output terminal of the i-th gate signal Gi in accordance with the fourth carry signal CR4. As a result, the output terminal of the i-th gate signal Gi may be pulled down to the first off-voltage VSS1.

The fifth holding portion 510 may include a sixteenth transistor T16. The sixteenth transistor T16 may include a gate electrode that receives the first clock signal CK1, a source electrode that receives a second off-voltage VSS2, and a drain electrode connected to the control node Q.

The carry portion 601 may include a fifteenth transistor T15 and a 15-1th transistor T15-1.

The fifteenth transistor T15 may include a gate electrode connected to the control node Q, a source electrode that receives the first clock signal CK1, and a drain electrode that outputs the third carry signal CR3. The 15-1th transistor T15-1 may include a gate electrode connected to the control node Q, a source electrode that receives the second clock signal CK2, and a drain electrode that outputs the second carry signal CR2.

As described above, the second carry signal CR2 may be provided to the i+1th stage. On the other hand, by separating the output terminal from which the i-th gate signal Gi is output, and the output terminal from which the second carry signal CR2 is output, it is possible to reduce delay of signal transmission for each stage, and to improve stability at low temperature.

Referring to FIG. 11, as the first clock signal CK1 of the low level is inverted to the high level in the second section t2, the first pull-up portion 110 may output the first clock signal CK1 as the i-th gate signal Gi. Further, the fifteenth transistor T15 is turned on by charging the control capacitor Cb with a voltage (e.g., a predetermined voltage), and may output the first clock signal CK1 as the third carry signal CR3.

Next, as the second clock signal CK2 of the low level is inverted to the high level in the third section t3, the second pull-up portion 120 may output the second clock signal CK2 as the i+1th gate signal Gi+1. The fifteenth transistor T15 may be turned on by charging the control capacitor Cb with a voltage (e.g., a predetermined voltage) to output the second clock signal CK2 as the second carry signal CR2.

In the fourth section t4, the fourth transistor T4 may be turned on in accordance with the fourth carry signal CR4 to provide the first off-voltage VSS1 to the output terminal of the i-th gate signal Gi. As a result, the potential of the output terminal of the i-th gate signal Gi is pulled down to the first off-voltage VSS1.

Next, in the fifth section t5, the second pull-down portion 320 may pull down the output terminal of the i+1th gate signal Gi+1 to the second off-voltage VSS2 in accordance with the fifth carry signal CR5. In addition, the third pull-down portion 330 may pull down the control node Q to the second off-voltage VSS2 in accordance with the fifth carry signal CR5.

On the other hand, the fifth holding portion 510 is turned on when the first clock signal CK1 is in a high level state, and may periodically maintain the potential of the control node Q at the same first off-voltage VSS1 as the third carry signal CR3.

On the other hand, the first holding portion 410 is turned on when the first gate-on voltage CKB1 is in the high level state, and provides the first off-voltage VSS1 to the output terminal of the i-th gate signal Gi, thereby making it possible to hold the output terminal of the i-th gate signal Gi at the first off-voltage VSS1. The second holding portion 420 is turned on when the first gate-on voltage CKB1 is in the high level state, and provides the second off-voltage VSS2 to the output terminal of the third carry signal CR3, thereby making possible to hold the output terminal of the third carry signal CR3 at the second off-voltage VSS2.

Further, the fourth holding portion 421 is turned on when the second gate-on voltage CKB2 is in the high level state and outputs the second off-voltage VSS2 to the output terminal of the second carry signal CR2, thereby making possible to hold the output terminal of the second carry signal CR2 at the second off-voltage VSS2.

Figure 12:
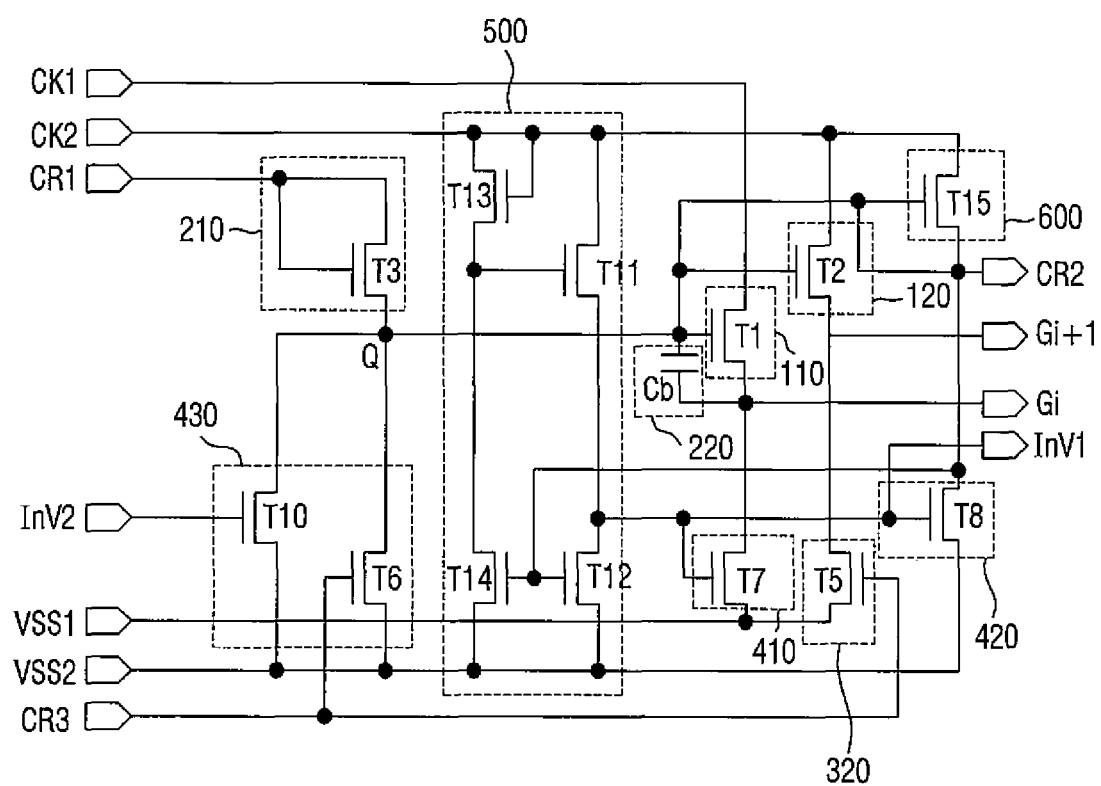
FIG. 12 is an equivalent circuit diagram illustrating a gate driving circuit according to another embodiment of the present invention.
Figure 13:
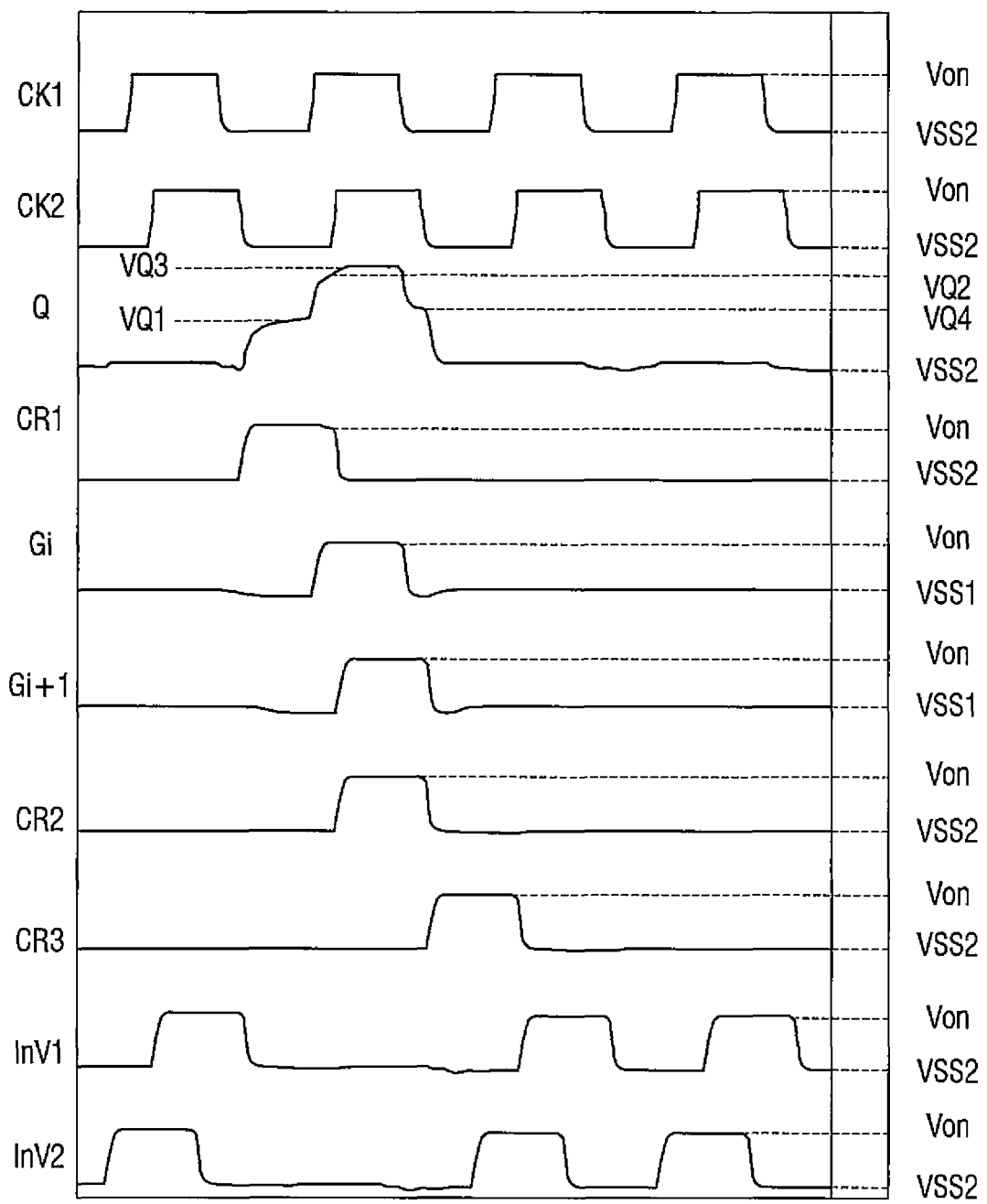
FIG. 13 is a waveform diagram for explaining the operation of the gate driving circuit illustrated in FIG. 12.

FIG. 12 is an equivalent circuit diagram illustrating a gate driving circuit according to another embodiment of the present invention. FIG. 13 is a waveform diagram for explaining the operation of the gate driving circuit illustrated in FIG. 12. Repeated descriptions of FIGS. 3 to 6 and 8 to 11 will not be provided. In addition, another embodiment of the same configuration will be referred by differently denoting only the reference numerals/characters.

Referring to FIGS. 12 and 13, the second holding portion 420 may include an eighth transistor T8. The eighth transistor T8 may include a gate electrode connected to the inverter 500, a source electrode that receives the second off-voltage VSS2, and a drain electrode connected to the output terminal of the second carry signal CR2. The eighth transistor T8 may be turned on in accordance with the voltage applied to the inverter 500 to provide the second off-voltage VSS2 to the output terminal of the second carry signal CR2.

The third holding portion 430 may include a sixth transistor T6 and a tenth transistor T10. The tenth transistor T10 may include a gate electrode that receives a second inverter signal InV2, a source electrode that receives the second off-voltage VSS2, and a drain electrode connected to the control node Q.

The tenth transistor T10 may be turned on in accordance with the second inverter signal InV2 to provide the second off-voltage VSS2 to the control node Q. That is, the tenth transistor T10 may periodically hold the voltage of the control node Q at the second off-voltage VSS2 each time the second inverter signal InV2 is in the high level state. As a result, it is possible to eliminate the ripple components of the control node Q.

While embodiments of the present invention have been particularly illustrated and described with reference to embodiments thereof, it will be understood by those of ordinary skill in the art that various changes in form and detail may be made therein without departing from the spirit and scope of embodiments of the present invention as defined by the following claims and their functional equivalents. The embodiments should be considered in a descriptive sense only, and not for purposes of limitation.

What is claimed is:

1. A gate driving circuit comprising:
a plurality of stages connected to each other in series, each of the stages being configured to output two gate signals,
wherein an i-th stage (i being a natural number greater than 2) comprises:
a controller for providing a first carry signal from a previous one of the stages to a control node;
a first pull-up portion for outputting a first clock signal as a first gate signal in accordance with a signal provided to the control node, and comprising a first transistor including a gate electrode connected to the control node, a source electrode for receiving the first clock signal, and a drain electrode connected to an output terminal of the first gate signal;
a second pull-up portion for outputting a second clock signal having a phase that is different from a phase of the first clock signal as a second gate signal in accordance with the signal provided to the control node, and comprising a second transistor including a gate electrode connected to the control node, a source electrode for receiving the second clock signal, and a drain electrode connected to an output terminal of the second gate signal;
a carry portion for outputting the second clock signal as a second carry signal in accordance with the signal provided to the control node;
a first holding portion for holding the first gate signal at a first off-voltage, and comprising a seventh transistor including a gate electrode connected to an inverting node, a source electrode for receiving the first off-voltage, and a drain electrode connected to the output terminal of the first gate signal;
a second holding portion for holding the second carry signal at a second off-voltage;
a second pull-down portion for outputting the first off-voltage as the second gate signal in accordance with a third carry signal, and comprising a fifth transistor including a gate electrode for receiving the third carry signal, a source electrode for receiving the first off-voltage, and a drain electrode connected to the output terminal of the second gate signal;

a third pull-down portion for providing the second off-voltage to the control node in accordance with the third carry signal; and an inverter configured to control operation of the first and second holding portions and configured to receive the second off-voltage, wherein:

the drain electrode of the first transistor is directly connected to the drain electrode of the seventh transistor;

the drain electrode of the second transistor is directly connected to the drain electrode of the fifth transistor;

the drain electrode of the seventh transistor is not connected to the drain electrode of the fifth transistor; and the gate electrode of the fifth transistor is not connected to the gate electrode of the seventh transistor.

2. The gate driving circuit of claim 1, wherein each of the stages is configured to sequentially output the first gate signal and the second gate signal, and wherein the first carry signal is a signal provided from an (i–2)-th stage.

3. The gate driving circuit of claim 1, wherein the controller comprises:

the second pull-down portion for providing the first off-voltage to the second pull-up portion in accordance with the third carry signal provided from a subsequent one of the stages.

4. The gate driving circuit of claim 3, wherein the third pull-down portion comprises a third pull-down transistor comprising:

a gate electrode for receiving the third carry signal;
an input terminal for receiving the second off-voltage; and
an output terminal connected to the control node.

5. The gate driving circuit of claim 1, further comprising a third holding portion for holding the control node at the second off-voltage.

6. The gate driving circuit of claim 5 wherein the inverter is further configured to control operation of the third holding portion.

7. The gate driving circuit of claim 1, wherein the output terminal of the first gate signal is for outputting the first gate signal, and wherein the output terminal of the second gate signal is for outputting the second gate signal.

8. The gate driving circuit of claim 7, wherein the controller comprises:

a control transistor comprising a gate electrode for receiving the first carry signal, the control transistor being connected to the control node; and a control capacitor comprising a first electrode connected to the gate electrode of the first transistor, and a second electrode connected to the output terminal of the first transistor.

9. The gate driving circuit of claim 1, wherein the controller comprises:
a gate electrode for receiving the first carry signal;
a control transistor connected to the control node; and
a control capacitor comprising a first electrode connected to the gate electrode of the first transistor, and a second electrode connected to the output terminal of the first transistor.

10. The gate driving circuit of claim 9, wherein the control transistor is a diode-connected transistor comprising an input terminal and the gate electrode that are connected to each other.

11. A display device comprising:
a display panel comprising a plurality of pixels connected to first to third gate lines adjacent one another;
a first gate driving circuit on a first side of the display panel, the first gate driving circuit being the gate driving circuit of claim 6, wherein the i-th stage is a third stage and wherein the first and second gate signals have phases that are different from each other; and
a second gate driving circuit on a second side of the display panel that is opposite the first side of the display panel, and comprising a fourth stage for outputting third and fourth gate signals having phases that are different from each other, wherein the third stage is configured to provide the first gate signal to a first side of the second gate line, wherein the fourth stage is configured to provide the fourth gate signal to a second side of the second gate line, wherein the third stage is configured to provide the second gate signal to a first side of the third gate line, and wherein the fourth stage is configured to provide the third gate signal to a second side of the first gate line.

12. The display device of claim 11,
wherein the controller comprises:
a gate electrode for receiving the first carry signal;
a first control transistor connected to the control node; and
a control capacitor comprising a first electrode connected to the gate electrode of the first transistor, and a second electrode connected to the output terminal of the first transistor.

13. The display device of claim 11, wherein the fourth stage comprises:
a second controller for providing a fourth carry signal to a second control node;
a third pull-up portion for outputting a third clock signal as the third gate signal in accordance with the fourth carry signal provided to the second control node; and
a fourth pull-up portion for outputting a fourth clock signal having a phase that is different from the phase of the third clock signal as the fourth gate signal in accordance with the fourth carry signal provided to the second control node.

14. The display device of claim 13, wherein the third pull-up portion comprises a third pull-up transistor comprising:
a gate electrode connected to the second control node;
an input terminal for receiving the third clock signal; and
an output terminal for outputting the third gate signal,
wherein the fourth pull-up portion comprises a fourth pull-up transistor comprising:
a gate electrode connected to the second control node;
an input terminal for receiving the fourth clock signal; and
an output terminal for outputting the fourth gate signal, and
wherein the second controller comprises:
a gate electrode for receiving the fourth carry signal;
a second control transistor connected to the second control node; and a second control capacitor comprising a first electrode connected to the gate electrode of the third pull-up transistor, and a second electrode connected to the output terminal of the third pull-up transistor.

15. The display device of claim 11, wherein the first gate driving circuit further comprises a fifth stage that is adjacent the third stage, and has a first output terminal and a second output terminal for outputting two respective gate signals having phases that are different from each other,
- wherein the second gate driving circuit further comprises a sixth stage that is adjacent the fourth stage, and has a first output terminal and a second output terminal for outputting two respective gate signals having phases that are different from each other,
- wherein the second output terminal of the fifth stage is connected to a first side of the first gate line, and
- wherein the first output terminal of the sixth stage is connected to a second side of the third gate line.

16. The gate driving circuit of claim 1,
- wherein the carry portion includes:
  - a carry transistor comprising a gate electrode connected to the control node, an input terminal for receiving the second clock signal, and an output terminal for outputting the second carry signal.

17. The gate driving circuit of claim 1, wherein the gate electrode of the seventh transistor is for receiving the second off-voltage.

18. The gate driving circuit of claim 1, wherein the first clock signal is generated as an on-voltage and the second off-voltage alternately.

* * * * *